United States Patent
Yusa

[19]

[11] Patent Number: 6,018,188
[45] Date of Patent: Jan. 25, 2000

[54] SEMICONDUCTOR DEVICE

[75] Inventor: Kazuyuki Yusa, Tokyo, Japan

[73] Assignee: NEC Corporation, Tokyo, Japan

[21] Appl. No.: 08/827,499

[22] Filed: Mar. 28, 1997

[51] Int. Cl.⁷ .......................... H01L 39/00; H01L 23/48; H01L 23/52; H01L 29/40

[52] U.S. Cl. .......................... 257/668; 257/780; 257/783; 257/778

[58] Field of Search ................... 257/780, 781, 257/783, 779, 786, 668, 670, 778, 693, 737; 228/180.22; 438/613

[56] References Cited

U.S. PATENT DOCUMENTS

| | | | |
|---|---|---|---|
| 3,868,724 | 2/1975 | Perrino | 257/686 |
| 5,040,588 | 8/1991 | Newkirk et al. . | |
| 5,119,864 | 6/1992 | Langensiepen et al. . | |
| 5,163,499 | 11/1992 | Newkirk et al. . | |
| 5,249,621 | 10/1993 | Aghajaniam et al. . | |
| 5,394,930 | 3/1995 | Kennerknecht . | |
| 5,616,421 | 4/1997 | Sawtell et al. . | |
| 5,618,635 | 4/1997 | Newkirk et al. . | |

FOREIGN PATENT DOCUMENTS

| | | | |
|---|---|---|---|
| 1-72547 | 3/1989 | Japan | 257/782 |
| 2-205328 | 8/1990 | Japan . | |
| 5-41408 | 2/1993 | Japan | 257/783 |

*Primary Examiner*—Mahshid D. Saadat
*Assistant Examiner*—Jhihan B Clark
*Attorney, Agent, or Firm*—Young & Thompson

[57] ABSTRACT

Electrode pads 6a are provided in the central portion of a semiconductor element 5, and the semiconductor element 5, which is mounted on a TCP tape 1 without device holes in this TCP tape, is mounted on the surface side of the TCP tape. In addition, the internal ends 2a of the wiring films 2 provided on the surface of the TCP tape 1 are extended all the way to the central portion of the semiconductor element 5 in conformity with these electrode pads 6a. The outside extension can be reduced and the TCP tape 1 shortened even when the wiring films 2 have the required length. In addition, the absence of device holes dispenses with the costs associated with punching out of the device holes, improves the mechanical strength of the wiring films 2, and enhances the holding force of the semiconductor element.

3 Claims, 3 Drawing Sheets

SEMICONDUCTOR DEVICE

BACKGROUND OF THE INVENTION

1. Field of the Invention

The present invention relates to a semiconductor device, and more particularly to a semiconductor device having a TCP (Tape Carrier Package) structure in which semiconductor elements are mounted on an insulating tape.

2. Description of Prior Art

In a semiconductor device having a conventional TCP structure, wiring films 12 of a desired pattern composed of semiconductor films are formed on the surface of a TCP tape 11, a device hole 19 larger than a semiconductor element 15 to be mounted on the TCP tape 11 is formed in the TCP tape 11, and the internal ends 12a of the wiring films 12 are extended into the device hole 19, as shown in FIGS. 1A and 1B, which are a plan view and a line 1B—1B enlarged cross-sectional view of an example of such a device. The semiconductor element 15 is positioned inside the device hole 19 on the reverse side of the TCP tape 11, and an electrode pad 16 disposed along the peripheral portions of the semiconductor element 15 is connected to the internal ends 12a of the wiring films 12. In addition, the semiconductor element 15, the TCP wiring films 12, and the TCP tape 11 are sealed with a resin 18. 13 is a protective film that covers the wiring films 12, and 14 are sprocket holes for advancing the TCP tape 11.

A disadvantage of a semiconductor device with such a conventional structure is that because a device hole 19 is bored in the TCP tape 11 in order to mount the semiconductor element 15, a punch die is needed to form the device hole 19, expenses are made for this equipment, and costs are increased due to the need to perform punching operations. In addition, forming the device hole 19 inevitably leads to arranging the internal ends 12a of the wiring films 12 along the peripheral portions of the device hole 19, and the surface area occupied by the device hole 19 and the wiring films 12 on the TCP tape 11 increases in the longitudinal direction of the tape when the wiring films 12 are extended further outward beyond the peripheral portions in order to obtain the necessary wiring pitch interval, making the surface area needed for the TCP tape 11 larger than the size of the semiconductor element 15. In particular, there is a danger that the length of the TCP tape in the longitudinal direction will increase, and the cost of the TCP tape will rise.

In such cases, it was proposed, as in the technique described in Japanese Laid-Open Patent Application 2-205328, to place an electrode pad for a semiconductor element in the center of the element and to position the internal ends of the wiring films of a TCP tape near the center, thereby preventing the outer peripheral portions of the wiring layer from extending outward while maintaining the length of the layer above a prescribed level. Increasing the length of the internal ends of a wiring layer inside the device hole, however, makes it more likely that the wiring layer will be deformed by the weight of the semiconductor element and ultimately lowers the reliability of the connection between the semiconductor element and the wiring layer.

With conventional semiconductor devices, however, wiring films are commonly formed by etching process on the surface of the TCP tape 11 after the device hole 19 has been punched out in the TCP tape 11, creating a danger that the wiring will be shorted if etching fails to provide sufficient processing accuracy. In addition, the wiring films are not aligned properly with the pads of semiconductor elements to be connected thereto, and electrical connections sometimes cannot properly be formed when the punching accuracy of the device hole is low. Yet another disadvantage is that touch shorts occur due to the contact of wiring layers with the edges of the semiconductor elements.

SUMMARY OF THE INVENTION

An object of the present invention is to provide an inexpensive and highly accurate semiconductor device devoid of the disadvantages of prior art that result from the presence of device holes.

According to the present invention, a distinctive feature of the semiconductor device of the present invention is that electrode pads are disposed in the central portion of a semiconductor element to be mounted on a TCP tape without device holes, and the semiconductor element is mounted on the surface side of the TCP tape, and that the internal ends of wiring films provided on the surface of the TCP tape are extended all the way to the central portion of the semiconductor element in conformity with these electrode pads. In addition, the wiring films are extended over a length needed to ensure the desired pitch interval for the external ends, and these external ends are allowed to protrude beyond the outside periphery of the semiconductor element. Furthermore, at least some of the plurality of the electrode pads are aligned widthwise of the TCP tape in the central portion of the semiconductor element.

DESCRIPTION OF THE PREFERRED EMBODIMENTS

Figure 1A:
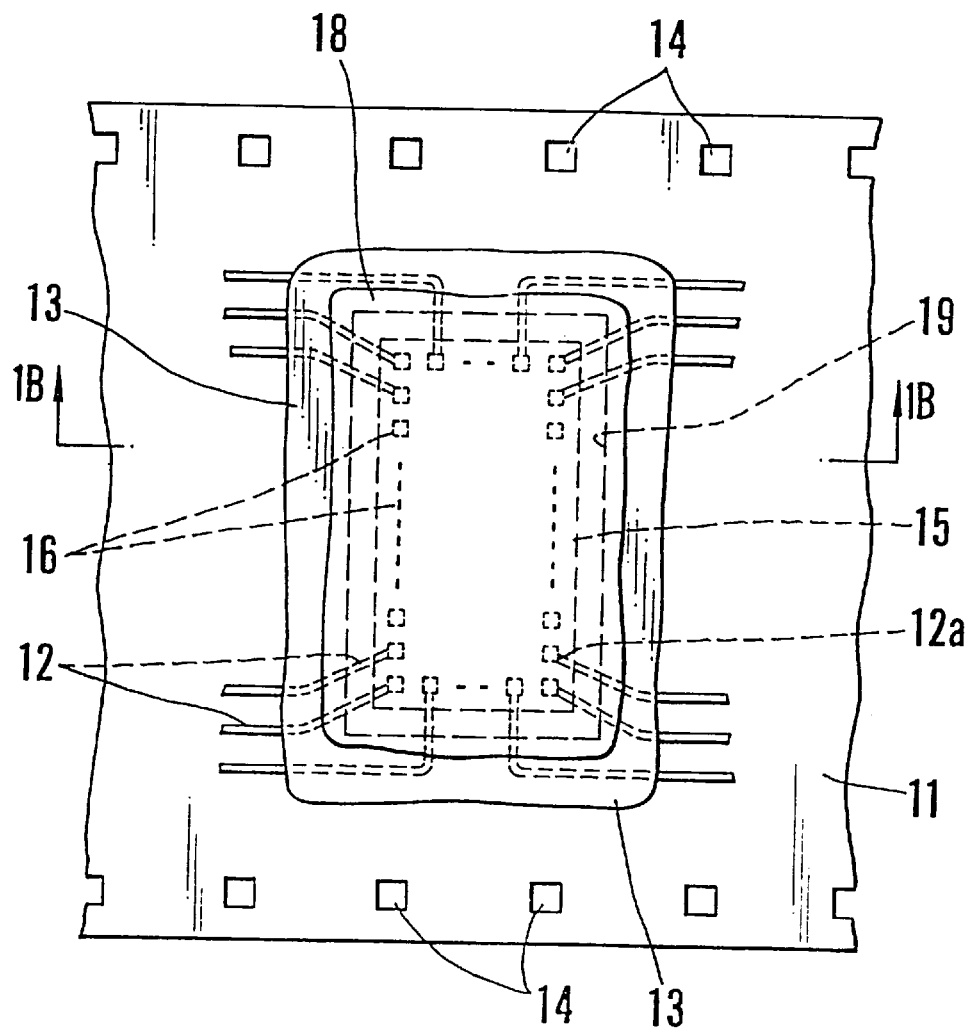
FIG. 1A is a plan view of an example of a semiconductor device with a conventional TCP structure.
Figure 1B:
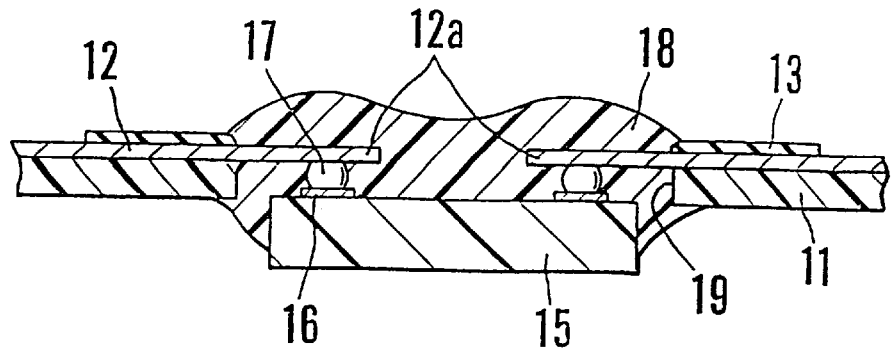
FIG. 1B is a cross section taken along line 1B—1B in FIG. 1A.
Figure 2A:
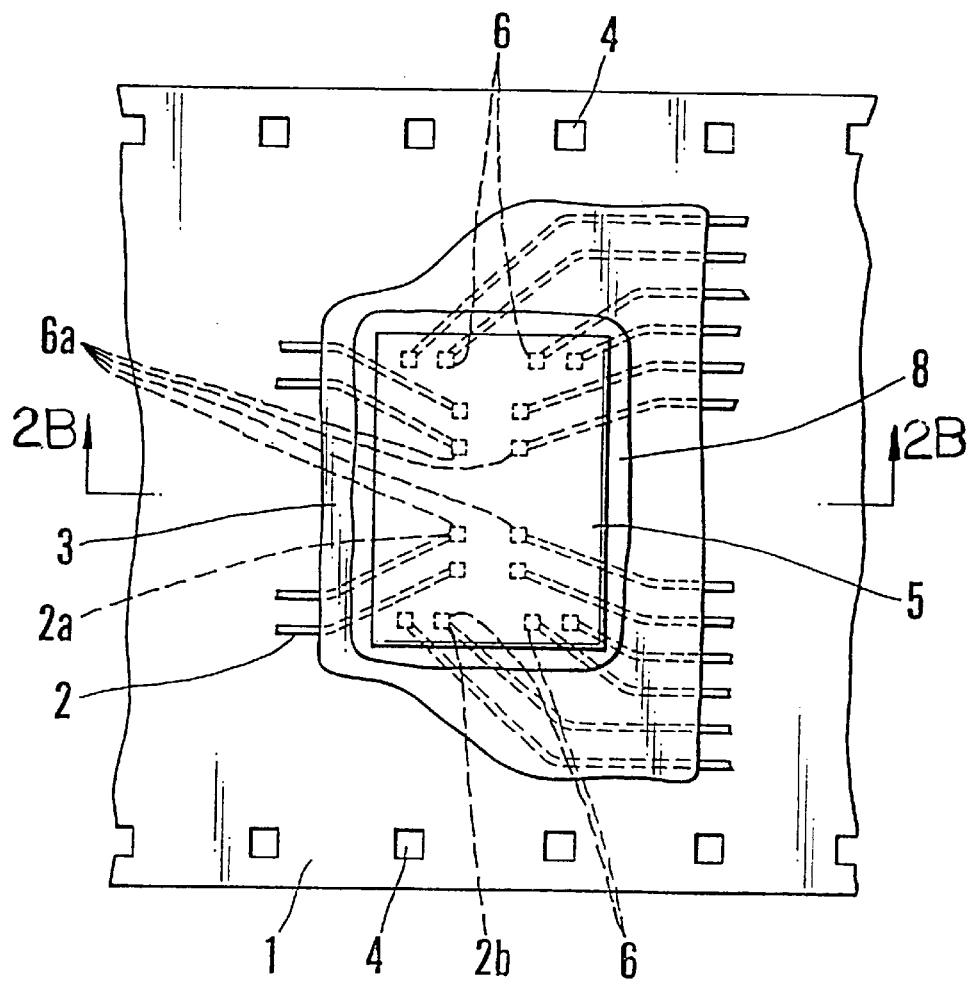
FIG. 2A is a plan view of a first embodiment of a semiconductor device with the TCP structure according to the present invention.
Figure 2B:
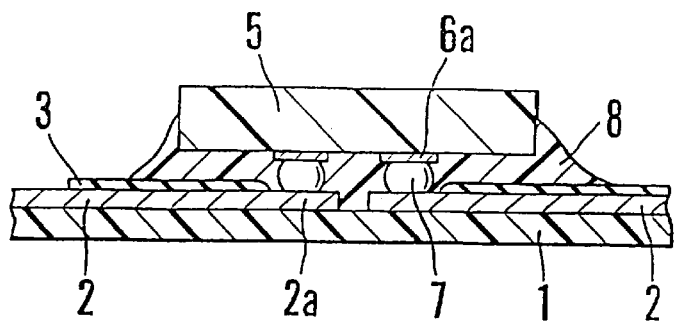
FIG. 2B is a cross section taken along line 2B—2B in FIG. 2A.

The present invention will now be described with reference to the drawings. FIGS. 2A and 2B are a plan view and a line 2B—2B enlarged cross section, respectively, according to the first embodiment of the present invention. Wiring films 2, which are composed of copper foil or other such electrically conductive films having the required pattern, are formed on the surface of the TCP tape 1 obtained by forming a thin epoxy resin film or the like into a tape. A protective film 3 is formed in such a way that it covers the surfaces of the TCP tape 1 and wiring films 2. The protective film 3 is removed from the internal ends 2a and external ends 2b of the wiring films 2 thereby exposing the wiring films 2. Sprocket holes 4 for advancing the tape are bored along the two side edges of the TCP tape 1.

Meanwhile, electrode pads 6a, which are some of the plurality of electrode pads 6 disposed on the surface of a semiconductor element 5 mounted on the TCP tape 1, are shifted toward the central portion of the semiconductor element 5 and disposed in two rows in the transverse direction or widthwise of the TCP tape 1. The internal ends 2a of the wiring films 2 on the TCP tape 1 are therefore disposed in such a way that the interval in the longitudinal direction is reduced in conformity with the electrode pads 6a. Meanwhile, the internal ends of the wiring films 2 that extend upward and downward are connected to electrode pads 6 other than the electrode pads 6a which electrode pads 6 are positioned near the upper and lower edges of the semiconductor element 5.

Bumps 7 are provided to each of the electrode pads 6 and 6a of the semiconductor element 5 and bonded under pressure to the surface side of the TCP tape 1, with the surface of the semiconductor element 5 facing down. Each of the electrode pads 6, including the electrode pads 6a, is thus connected to the corresponding internal ends 2a of the wiring films 2 via the bumps 7, completing the electrical connection between the semiconductor element 5 and the wiring films 2. Gaps between the semiconductor element 5 and the TCP tape 1 are then filled with a resin sealant 8, yielding a package in which the connections, including the bumps 7, are sealed with this resin 8.

In the semiconductor device thus configured, therefore, the pads 6a are positioned at narrower intervals in the longitudinal direction of the TCP tape 1, and the interval between the internal ends 2a of the wiring films 2 on the TCP tape 1 is proportionately reduced. Consequently, the external ends 2b can be extended a shorter distance beyond the long sides of the semiconductor element 5 in the two outward longitudinal directions of the TCP tape 1, and the extension beyond the two sides of the semiconductor element can be reduced, even when the wiring films 2 are extended to achieve a prescribed distance between the internal ends 2a and the external ends 2b. It is thus possible to reduce the length of the TCP tape 1 needed for the wiring films 2 and to lower the cost of the TCP tape 1.

In addition, the device holes needed in the past can be dispensed with because the semiconductor element 5 is connected to the TCP tape 1 on the surface side of the TCP tape 1, where the wiring films 2 are formed. As a result, even when the internal ends 2a of the wiring films 2 are extended to the central portion of the semiconductor element 5, the parts located in the vicinity of the internal ends 2a can be held with the aid of the TCP tape 1, and the holding force of the semiconductor element 5 can be increased without lowering the mechanical strength or allowing the weight of the mounted semiconductor element 5 to deform the wiring films 2. In addition, dispensing with the device holes makes it possible to overcome the problems caused by the presence of the device holes, namely, to overcome the cost increases resulting from the use of dies, the shorting caused by punch chips, and the like.

Figure 3:
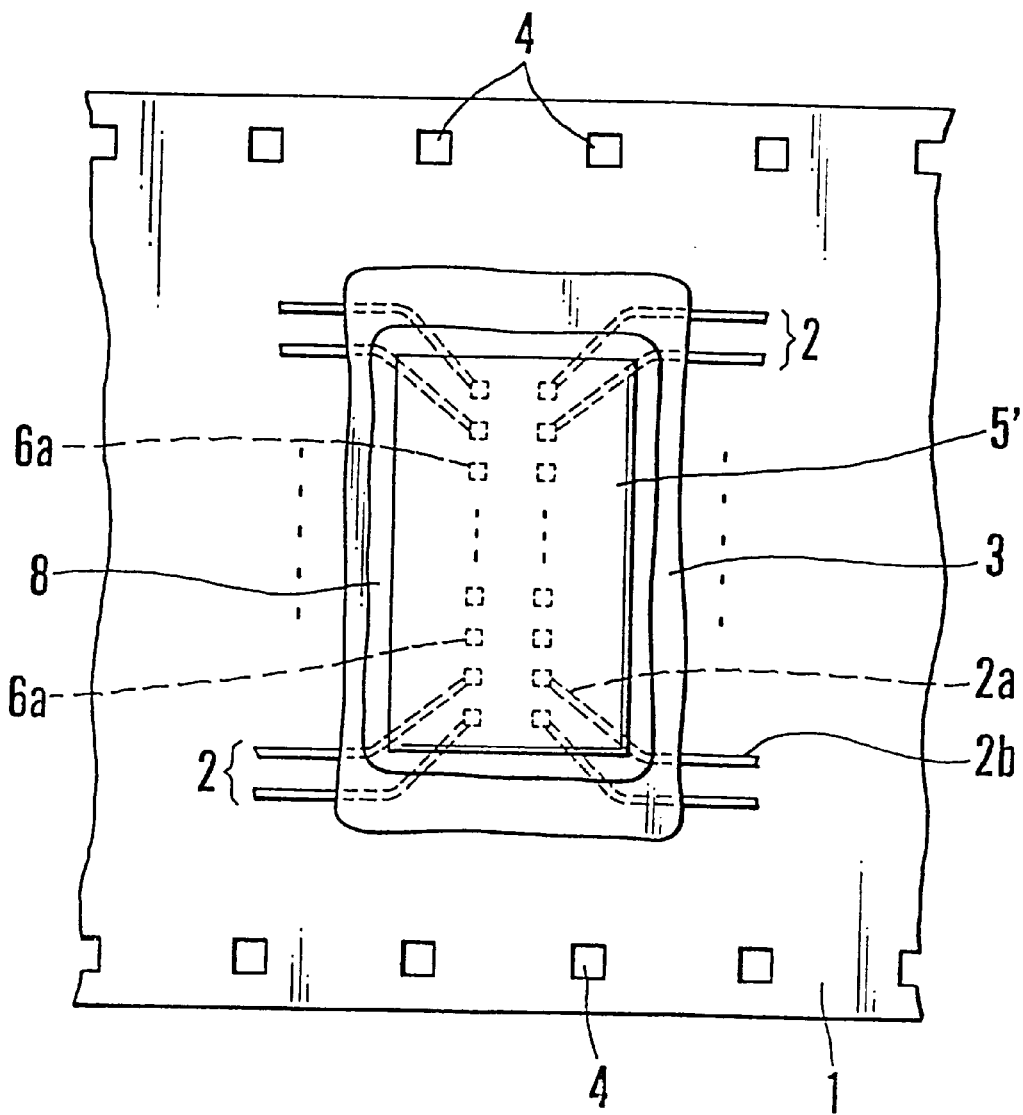
FIG. 3 is a plan view of a second embodiment of a semiconductor device with the TCP structure according to the present invention.

FIG. 3 is a plan view of the second embodiment of the present invention. In this embodiment, which can be adapted to a semiconductor element 5' obtained by removing the electrode pads disposed along the short sides of the semiconductor element 5 in the first embodiment shown in FIG. 2A, all the electrode pads 6a are gathered in the central portion of the semiconductor element 5 and are disposed in two rows at minute intervals in the transverse direction or widthwise of the TCP tape 1. As in the first embodiment, the internal ends 2a of the wiring films 2 provided on the TCP tape 1 are connected via bumps to the electrode pads 6a, and each of the wiring films 2 is configured in such a way that it is brought out and extended in the longitudinal direction of the TCP tape 1 as much as possible. In this embodiment as well, the semiconductor element 5' is mounted on the surface side of the TCP tape 1, and there are no device holes in the TCP tape 1.

In the second embodiment as well, the internal ends 2a of the wiring films 2 are extended all the way to the central portion of the semiconductor element 5', making it possible to reduce the distance over which the external ends 2b of the wiring films 2 extend in the two outward directions beyond the long sides of the semiconductor element 5, to reduce the whole length of the TCP tape 1, and to aid in lowering the cost of the TCP tape 1. In addition, the absence of device holes in the TCP tape 1 improves the holding reliability of the semiconductor element 5 without lowering the mechanical strength of the areas near the internal ends 2a when the internal ends 2a of the wiring films 2 are extended all the way to the central portion of the semiconductor element 5. Another feature of the second embodiment is that extending the wiring films 2 in the longitudinal direction of the TCP tape 1 makes it possible to reduce the surface area occupied by the wiring films in the transverse direction or widthwise of the TCP tape 1, to reduce the width of the TCP tape 1 as needed, and to aid in lowering the costs.

Although the embodiment described above involved arranging electrode pads in two rows in the central portion of a semiconductor element, the arrangement can be changed to a four- or two-row staggered arrangement or the like as needed. In addition, the embodiments described above involved mounting the external ends of wiring films to a mounting substrate or other component on the surface side of the TCP tape, but it is also possible to form a hole in the TCP tape in the area containing these external ends and to connect the external ends of the wiring films from the reverse side of the TCP tape to a mounting substrate or the like through this hole.

As described above, the present invention relates to a semiconductor element to be mounted on a TCP tape without the formation of device holes in the TCP tape such that electrode pads are disposed in the central portion of the semiconductor element in the transverse direction or widthwise of the TCP tape, the semiconductor element is mounted on the surface side of the TCP tape, and the internal ends of the wiring films provided on the surface of the TCP tape are extended all the way to the central portion of the semiconductor element in conformity with these electrode pads, making it possible to reduce the length of the TCP tape and to obtain advantages in terms of cost cutting. In addition, dispensing with the device holes makes it unnecessary to install equipment or to perform processes aimed at punching out such device holes, aids in cost cutting, and makes it possible to avoid the electrical shorts between wiring films caused by the low accuracy of etching performed in order to form wiring films, to prevent the holding reliability of semiconductor elements from being lowered by the reduced mechanical strength of the wiring films, and the like.

What is claimed is:

1. A tape carrier mounted semiconductor device having a reduced package size, comprising:

an insulating tape carrier providing a mounting surface;

plural electrically conductive wiring films formed on said insulating tape carrier, each said wiring film having an internal end and an external end;

a protective film formed over said plural electrically conductive wiring films and portions of said insulating tape carrier intermediate said plural electrically conductive wiring films leaving said internal ends and said external ends exposed, said protective film having a film thickness and protecting said plural electrically conductive wiring films;

electrically conductive bumps having a height greater than said film thickness located at said internal ends for providing pressure bonding points at the internal ends of said plural electrically conductive wiring films; and a semiconductor element with electrode pads aligned and bonded with said electrically conductive bumps.

2. The device of claim 1, wherein said electrode pads are removed from the perimeter of said semiconductor element.

3. The device of claim 2, wherein said electrode pads are located within the interior of said semiconductor element so that a prescribed distance between said internal ends and said external ends is maintained with minimum extension of said external ends beyond said semiconductor device to minimize said package size of said tape carrier mounted semiconductor device.

* * * * *